United States Patent [19]

Bayani

[11] Patent Number: 5,663,871
[45] Date of Patent: Sep. 2, 1997

[54] DUAL PCB SUBASSEMBLY FOR AN ELECTRONIC DEVICE HAVING AN ELECTRONIC COMPONENT

[75] Inventor: Raizon J. Bayani, Cebu, Philippines

[73] Assignee: Timex Corporation, Middlebury, Conn.

[21] Appl. No.: 502,839

[22] Filed: Jul. 11, 1995

[51] Int. Cl.$^6$ .............................. H05K 1/11; H05K 7/02; H01R 23/68
[52] U.S. Cl. .................. 361/784; 361/728; 361/735; 361/744; 361/790; 361/791; 361/803
[58] Field of Search .................. 174/138 G; 257/98; 361/733, 728, 735, 742, 744, 784, 790, 791, 803; 362/11, 84, 118, 217, 219, 221, 224, 225; 368/276, 261

[56] References Cited

U.S. PATENT DOCUMENTS 2,934,814  5/1960  Williams et al. ..................... 361/744

*Primary Examiner*—Donald Sparks
*Attorney, Agent, or Firm*—William C. Crutcher

[57] ABSTRACT

A printed circuit board (PCB) subassembly of first and second PCB's disposed back to back, a group of jumper pins extending through the PCB's to electrically connect the circuit elements of the first and second PCB's and supporting the second PCB from the first PCB in back to back relationship, a cutout defined in the first PCB, and an electro-optic sensor disposed on the second PCB and extending through the cutout in the first PCB.

3 Claims, 2 Drawing Sheets

DUAL PCB SUBASSEMBLY FOR AN ELECTRONIC DEVICE HAVING AN ELECTRONIC COMPONENT

BACKGROUND OF THE INVENTION

This invention relates to a subassembly of printed circuit boards for use in an electronic device, such as an electronic wristwatch, and more particularly to a printed circuit board subassembly useful in an electronic device utilizing an electro-optic sensor.

A common construction in an electronic wristwatch utilizes a printed circuit board, on which are disposed various circuit elements connected in circuit relationship with contact pads which, are connected in turn with other circuit elements or with leads to other necessary electrical components, such as pushbuttons, power supplies, liquid crystal displays and the like. In small electronic devices, such as wristwatches, very little space is available and, as integrated circuits get larger and more complex, the printed circuit board (PCB) becomes more crowded.

The addition of an electro-optic sensor and its associated circuit elements to an electronic wristwatch, such as the Timex® Data Link™ watch manufactured by applicant's assignee, results in too many circuit elements to conveniently be carried on a single PCB. It is convenient to group the electro-optic circuit elements on a second PCB for separate handling and testing. The problem of placement of a second PCB in the electronic wristwatch then becomes difficult due to the fact that the LCD display which is connected to the normal PCB, and the electro-optic sensor which is connected to the other PCB must both be exposed at the top of the wristwatch facing the user.

Accordingly one object of the present invention is to provide an improved PCB subassembly for an electronic device.

Another object of the invention is to provide an improved PCB subassembly for an electronic wristwatch having an electro-optic sensor.

SUMMARY OF THE INVENTION

Briefly stated, the invention comprises the improvement in an electronic device of a PCB subassembly of first and second PCB's each having front and back sides with a plurality of circuit elements thereon, the first and second PCB's being disposed back to back, means electrically connecting the circuit elements of the first and second PCB's and supporting the second PCB from the first PCB in back to back relationship, a cutout defined in the first PCB, and an electro-optic sensor disposed on the second PCB and extending through the cutout in the first PCB.

In the preferred embodiment, the first PCB has a plurality of first contact pads disposed on the front side thereof and a plurality of first circuit elements connected in circuit relationship with the first contact pads, the second PCB has a plurality of second contact pads disposed on the front side thereof and a plurality of second circuit elements connected in circuit relationship with the second contact pads, said first and second contact pads being arranged so as to have overlapping projected areas, a plurality of pairs of aligned holes defined by said first and second contact pads, said pairs of aligned holes being disposed within said projected areas, a plurality of electrically conductive, substantially rigid jumper pins, each jumper pin extending through a said pair of aligned holes so as to define projecting ends on the respective front sides of said first and second PCB's, and means rigidly and electrically connecting said projecting ends to the first and second contact pads so as to support the second PCB from the first PCB and to electrically connect the first and second circuit elements.

The second PCB further includes a plurality of third contact pads, the cutout defined in the first PCB being located adjacent said third contact pads, and the electro-optic sensor electrically connected to and supported by the third contact pads and extending through said cutout so as to be exposed on the front side of said first PCB.

DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description, taken in connection with the accompanying drawing, in which:

FIG. 1 is an exploded perspective view of the dual PCB subassembly with opto-electric sensor, FIG. 2 is a back plan view of the assembled subassembly, and FIG. 3 is an enlarged partial side elevational view, in section, through a typical jumper pin connection.

DESCRIPTION OF THE PREFERRED EMBODIMENT

Figure 1:
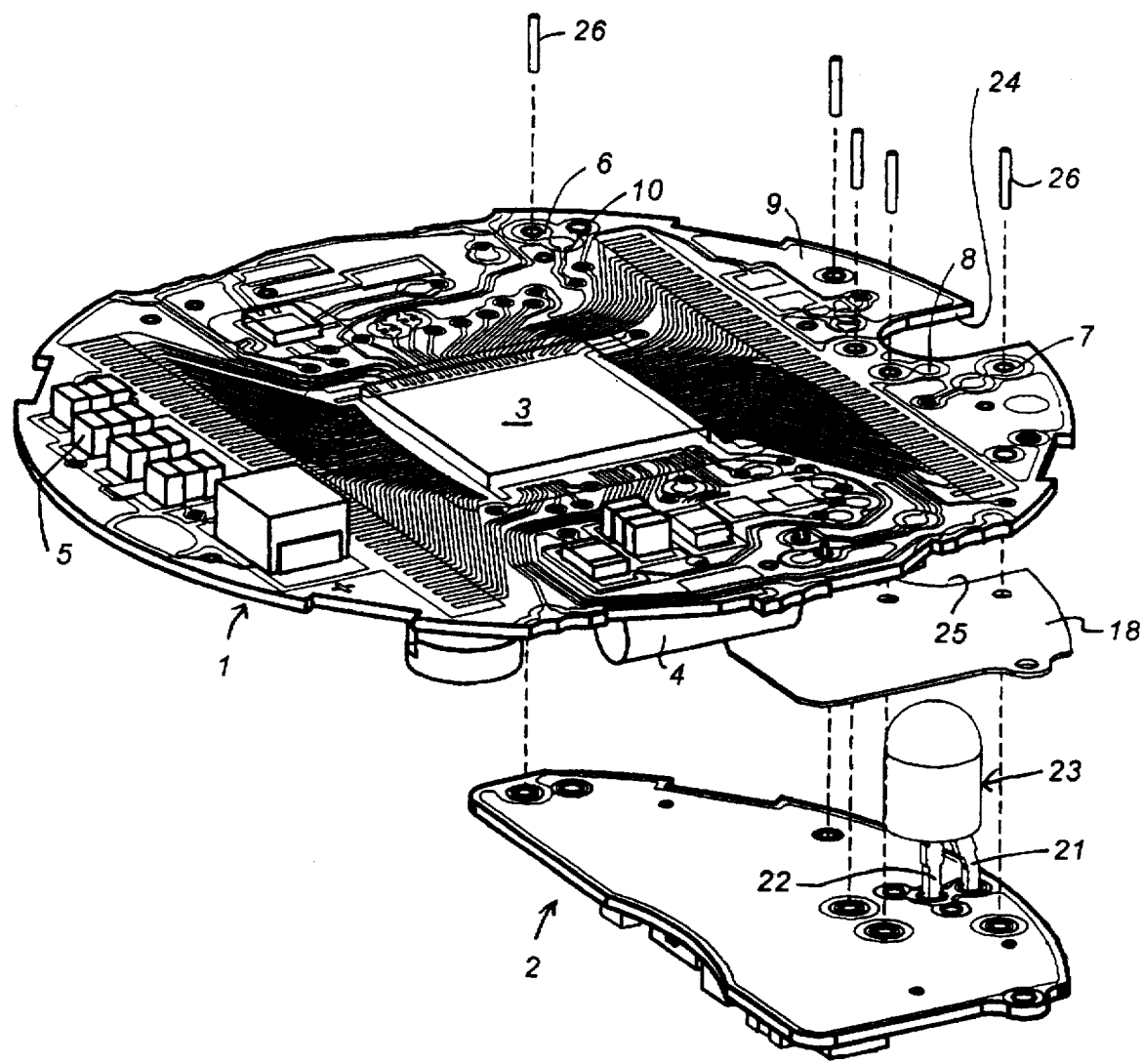
Figure 2:
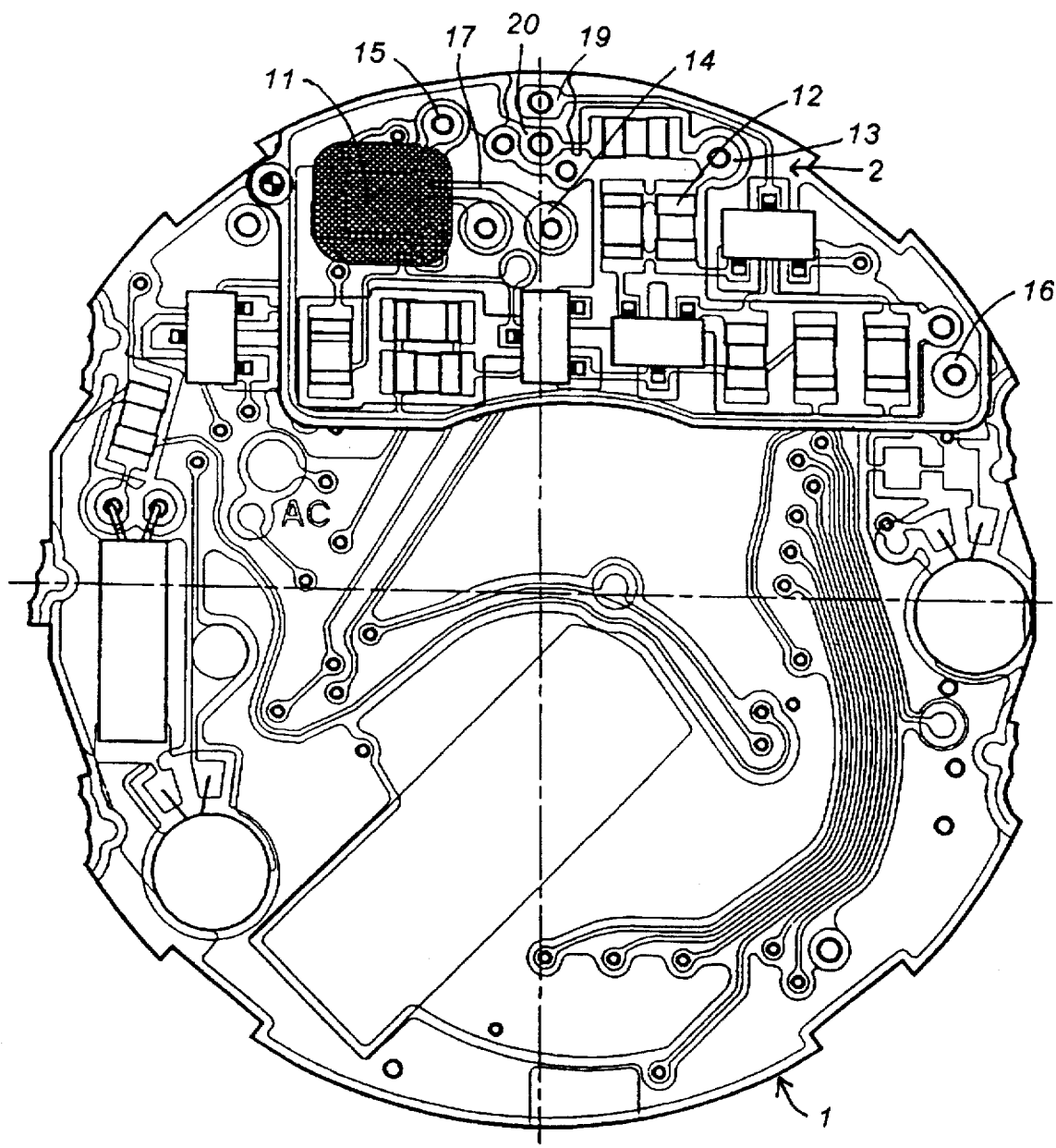
Figure 3:
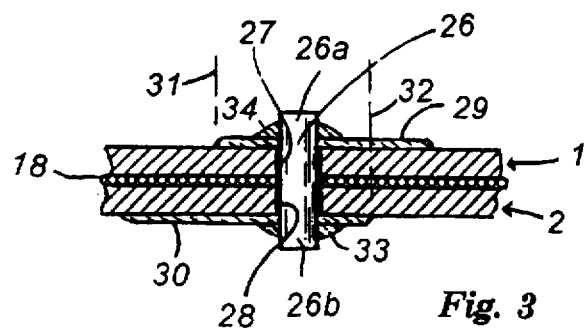

Referring now to FIG. 1 of the drawing, a first PCB 1 and a second PCB 2 are shown in an exploded drawing so as to illustrate the manner of connecting them into a subassembly. PCB 1 includes a number of circuit elements, such as integrated circuit 3, quartz crystal 4, capacitors 5 (first circuit elements) connected in circuit relationship with first contact pads 6, 7, 8, 9 disposed on the front side of the PCB, by means of the conventional "traces" such as 10. The second PCB 2, which may be seen in plan view in FIG. 2, is similarly provided with circuit elements such as integrated circuit 11, capacitors 12, (second circuit elements) disposed on the front side of PCB 2. These are connected in circuit relationship with second contact pads such as 13, 14, 15, 16 on the front side of PCB 2 by means of the conventional traces such as 17.

Referring back to FIG. 1 of the drawing, PCB 1 and 2 are oriented with their front sides facing in opposite directions away from one another, so as to be disposed in back-to-back relationship. They are separated by an insulating member 18.

Referring again to FIG. 2 of the drawing, PCB 2 includes on the front side thereof third contact pads 19, 20. The third contact pads 19, 20 serve to receive the connection pins 21, 22 of an opto-electric sensor 23.

PCB 1 includes a cutout 24, with a corresponding cutout 25 in insulating member 18. The two cutouts are disposed adjacent the third contact pads 19, 20, so that the opto-electric sensor 23 supported on pins 21, 22 projects through the cutouts and is exposed on the front side of PCB 1.

PCB 2 is electrically connected to and supported by PCB 1 by means of jumper pins 26. The jumper pins are substantially rigid, electrically conductive wires which extend through an aligned pair of holes 27, 28 in PCB's 1, 2 respectively, so as to leave projecting ends 26a, 26b extending above and below the respective front sides of the boards 1 and 2 with their associated first and second contact pads 29, 30. Contact pads 29, 30 may be of irregular shape, but are arranged to have overlapping projected areas as indicated by the dashed lines 31, 32. Beads of solder 33, 34 applied during the assembly process serve to rigidly and electrically connect the projecting ends 26a, 26b to the first and second contact pads 29, 30.

While it is not necessary that all of the first and second contact pads be connected in electrical circuit relationship with circuit elements, the jumper pins 26 may conveniently serve this purpose while also supporting the second PCB from the first PCB inside the electronic wristwatch. Moreover, this construction of the preferred embodiment shown permits the addition of the opto-electric sensor with its specifically required circuit elements to be manufactured and tested as a separate device before it is connected to the first PCB.

While there has been described what is considered to be the preferred embodiment of the invention, other modifications will become apparent to those skilled in the art, and it is desired to secure in the appended claims all such modifications as fall within the true spirit and scope of the invention.

I claim:

1. A PCB subassembly for an electronic electro-optical device, comprising:

a first PCB having a plurality of first contact pads disposed on the front side thereof and a plurality of first circuit elements connected in circuit relationship with the first contact pads, a second PCB having a plurality of second contact pads disposed on the front side thereof and a plurality of second circuit elements connected in circuit relationship with the second contact pads, said first and second PCB's being disposed back to back and having said first and second contact pads being arranged so as to have overlapping projected areas, a plurality of pairs of aligned holes defined by said first and second contact pads, said pairs of aligned holes being disposed within said projected areas, a plurality of rigid jumper pins electrically connecting the circuit elements of said first and second PCB's and supporting the second PCB from the first PCB in back-to-back relationship, each said jumper pin extending through a said pair of aligned holes so as to define projecting ends on the respective front sides of said first and second PCB's, and having solder beads connecting said projecting ends to the first and second contact pads so as to support the second PCB from the first PCB and to electrically connect the first and second circuit elements, a cutout defined in the first PCB, and an electro-optic sensor disposed on the second PCB and extending through the cutout in the first PCB.

2. The combination according to claim 1, comprising a plurality of third contact pads disposed on the front side of said second PCB, and said cutout defined in said first PCB being located adjacent said third contact pads and adapted to receive said opto-electric sensor therethrough.

3. The combination according to claim 2, wherein said opto-electric sensor is supported from said third contact pads so as to extend above the back side of the second PCB, and further including a sheet of insulation separating the backside of the first PCB from the second PCB, said insulating sheet also having a cutout adapted to receive said electro-optic sensor therethrough.

* * * * *